(12) United States Patent
Meunier-Beillard et al.

(10) Patent No.: US 8,541,812 B2
(45) Date of Patent: Sep. 24, 2013

(54) SEMICONDUCTOR DEVICE AND METHOD OF MANUFACTURE THEREOF

(75) Inventors: Philippe Meunier-Beillard, Kortenberg (BE); Mark C. J. C. M. Kramer, Sittard (NL); Johannes J. T. M. Donkers, Valkenswaard (NL); Guillaume Boccardi, Leuven (BE)

(73) Assignee: NXP B.V., Eindhoven (NL)

( * ) Notice: Subject to any disclaimer, the term of this patent is extended or adjusted under 35 U.S.C. 154(b) by 319 days.

(21) Appl. No.: 12/918,542

(22) PCT Filed: Feb. 26, 2009

(86) PCT No.: PCT/IB2009/050782
§ 371 (c)(1),
(2), (4) Date: May 25, 2011

(87) PCT Pub. No.: WO2009/107087
PCT Pub. Date: Sep. 3, 2009

(65) Prior Publication Data
US 2011/0215417 A1    Sep. 8, 2011

(30) Foreign Application Priority Data

Feb. 28, 2008    (EP) .................................... 08102138
Feb. 28, 2008    (EP) .................................... 08102139

(51) Int. Cl.
*H01L 29/66*    (2006.01)
(52) U.S. Cl.
USPC ........... 257/162; 257/254; 257/263; 257/265; 257/E21.311; 257/E21.379; 438/128; 438/189; 438/229
(58) Field of Classification Search
USPC .................. 257/162, 254, 263, 265, E21.311, 257/E21.379; 438/128, 189, 229
See application file for complete search history.

(56) References Cited

U.S. PATENT DOCUMENTS

| 5,445,976 A | 8/1995 | Henderson et al. |
| 6,221,783 B1 | 4/2001 | Park et al. |
| 7,008,851 B2 | 3/2006 | Johansson et al. |

(Continued)

FOREIGN PATENT DOCUMENTS

| EP | 0339960 A2 | 11/1989 |
| WO | 2006/114746 A2 | 11/2006 |
| WO | 2007/144828 A1 | 12/2007 |

OTHER PUBLICATIONS

Non-Final Rejection of U.S. Appl. No. 12/918,524 filed on Dec. 19, 2012.*
Choi, L. J., et al; A Novel Isolation Scheme Featuring Cavities in thef Collector for Ahigh Speed 0.13UM SiGe: C BiCMOS Technology ; IMEC.
Yamamoto, Y., et al; "Chemical Vapor Phase Etching of Polycrystalline Selective to Epitaxial Si and SiGe"; Thin Solid Films, vol. 508; p. 297-300 (2006).

(Continued)

*Primary Examiner* — Telly Green

(57) ABSTRACT

A semiconductor device (10) comprising a bipolar transistor and a field effect transistor within a semiconductor body (1) comprising a projecting mesa (5) within which are at least a portion of a collector region (22d and 22e) and a base region (33d) of the bipolar transistor. The bipolar transistor is provided with a first insulating cavity (92) provided in the collector region (22d and 22e). The base region (33d) is narrower in the plane of the substrate than the collector region (22d and 22e) due to a second insulating cavity (94) provided around the base region (33d) and between the collector region (22d and 22e) and the emitter region (4). By blocking diffusion from the base region the first insulating cavity (92) provides a reduction in the base collector capacitance and can be described as defining the base contact.

18 Claims, 22 Drawing Sheets

(56) References Cited

U.S. PATENT DOCUMENTS

Figure 1:
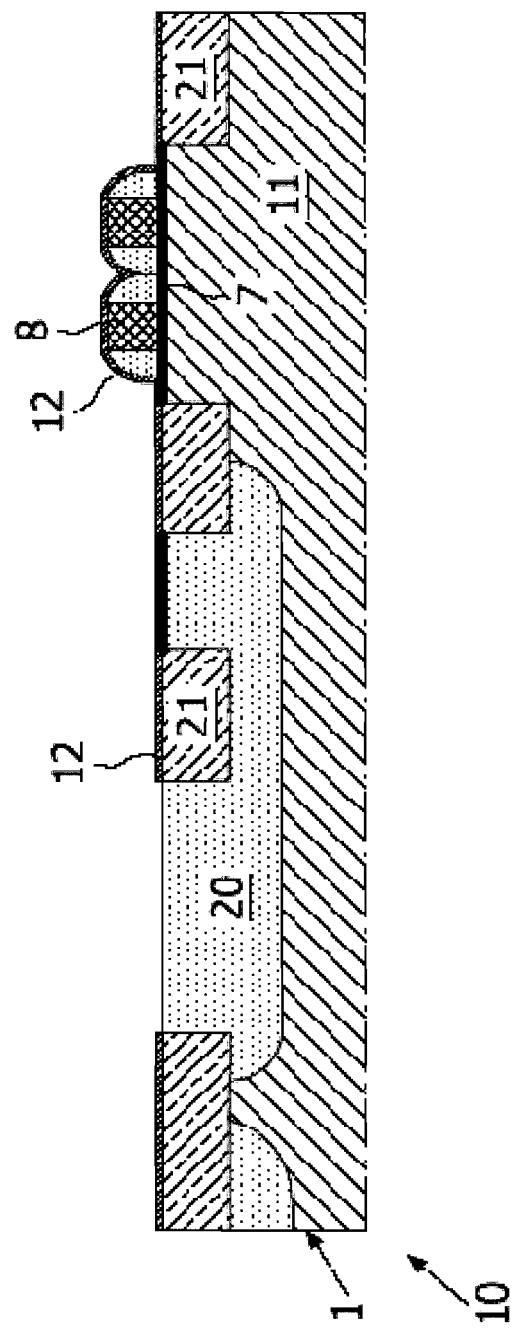

| | | |
|---|---|---|
| 8,476,675 B2* | 7/2013 | Meunier-Beillard et al. .. 257/162 |
| 2002/0027232 A1 | 3/2002 | Shigematsu et al. |
| 2005/0116254 A1 | 6/2005 | Verma et al. |
| 2005/0212087 A1 | 9/2005 | Akatsu et al. |
| 2011/0215417 A1* | 9/2011 | Meunier-Beillard et al. .. 257/378 |

OTHER PUBLICATIONS

Donkers, J.J.T.M., et al; "A Novel Fully Self-Aligned SiGe: C HBT Architecture Featuring a Single Step Epitaxial Collector-Base Process"; 3 Pages.

International Search Report and Written Opinion for Application PCT/IB2009/050782 (Feb. 26, 2009).

* cited by examiner

SEMICONDUCTOR DEVICE AND METHOD OF MANUFACTURE THEREOF

The present invention relates to a semiconductor device with a substrate and a semiconductor body comprising a bipolar transistor and a field effect transistor. The bipolar transistor comprises, in the following order, a collector region, a base region, and an emitter region, wherein the semiconductor body comprises a projecting mesa (which may also be termed pedestal) within which at least a portion of the collector region and a portion of the base region are present and which is surrounded by an isolation region. Such a device, in particular when constructed as a heterojunction bipolar transistor (HBT), is highly suitable for high-frequency amplifier applications. The invention also relates to a method of manufacturing such a device.

Such a device is known from the American patent document U.S. Pat. No. 7,008,851 published on Mar. 7, 2006. A bipolar transistor is described therein comprising a mesa within which a portion of the collector region and of the base region is located. A region forming a subcollector of the transistor is furthermore present in the substrate. The mesa comprises an n-type epitaxial silicon layer forming said portion of the collector region and a p-type epitaxial layer which contains germanium and within which the base region is formed. The mesa is surrounded by an isolating layer that was formed, in that the walls of a groove (a so-termed shallow trench) surrounding the mesa are coated with an isolating layer of silicon dioxide and this groove is subsequently filled up further with an oxide.

A disadvantage of the known device is that the high-frequency characteristics thereof are in need of improvement. In addition, the manufacture of the known device is comparatively complicated.

US 2005/0212087 A discloses a structure and method for forming a bipolar transistor. Cavities are formed below a Si:Ge intrinsic base of the transistor and around the collector.

International patent application PCT/IB2007/052220, incorporated herein by reference, describes a device of the kind mentioned in the opening paragraph in which the semiconductor device further comprises a field effect transistor with a source region, a drain region, an interposed channel region, and a superimposed gate dielectric and a gate region, which gate region forms a highest part of the field effect transistor, and the height of the mesa is greater than the height of the gate region. Parasitic components of the transistor are etched away using a dummy emitter thereby tending to provide a self-aligned collector extrinsic-base junction. However, this approach tends to make it difficult to control, for example, the base contact between the intrinsic base and boron-doped polysilicon used in the device.

The present inventors have realised it would be desirable to provide a semiconductor device comprising a bipolar transistor and a field effect transistor device, and manufacturing method therefor, in which one or more self-aligned insulation-filled cavities are included and which tend to define the base contact and tend to allow reduction of the base-collector capacitance, and also tend to further reduce parasitic components, and in which the layer or layers, from which the cavity or cavities are formed by etching away part of the layer or layers, and in which the cavities tend to reduce the collector diffusion.

In a first aspect, the present invention provides a semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region; wherein: the semiconductor device further comprises a field effect transistor; the bipolar transistor is provided with a first insulating cavity provided in the collector region; and the base region is narrower in the plane of the substrate than the collector region due to a second insulating cavity provided around the base region and between the collector region and the emitter region.

The semiconductor device may comprise a remaining portion of a layer defining the first insulating cavity and surrounded by the first insulating cavity that blocks diffusion from the collector region.

The remaining portion of the layer may be a SiGe:C layer.

A dummy emitter may be provided.

The first insulating cavity may be filled with a gas.

The gas may be air.

The first insulating cavity may be filled with silicon dioxide.

The semiconductor device may further comprise at least one spacer provided adjacent to a portion of the projecting mesa so as to reduce base-collector capacitance.

The isolating region may be lower than the base region.

In a further aspect, the present invention provides a method of manufacturing a semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region; further providing the semiconductor device with a field effect transistor; providing the bipolar transistor with a first insulating cavity in the collector region; and providing the bipolar transistor with a second insulating cavity, the second insulating cavity being provided around the base region and between the collector region and the emitter region such that the base region is narrower in the plane of the substrate than the collector region.

There may be provided a remaining portion of a layer defining the first insulating cavity and surrounded by the first insulating cavity that blocks diffusion from the collector region.

The remaining portion of the layer may be a SiGe:C layer.

A dummy emitter may be provided.

The first insulating cavity may be filled with a gas.

The gas may be air.

The first insulating cavity may be filled with silicon dioxide.

The method may further comprise providing at least one spacer adjacent to a portion of the projecting mesa so as to reduce base-collector capacitance.

The isolating region may be etched back lower than the base region.

Thus a semiconductor device comprising a bipolar transistor and a field effect transistor device, and manufacturing method therefor, are provided in which insulating cavities are provided and in which the layers from which the insulating cavities are formed provide a reduction in the collector diffusion.

Embodiments of the present invention will now be described, by way of example, with reference to the accompanying drawings, in which:

FIGS. 1 to 16 diagrammatically and in a cross-section taken perpendicularly to the thickness direction show a first example of a device according to the invention in consecutive stages of its manufacture by a method according to the invention.

FIGS. 17 to 22 diagrammatically and in a cross-section taken perpendicularly to the thickness direction show a further example of a device according to the invention in certain consecutive stages of its manufacture by a method according to the invention.

The Figures are not drawn true to scale, the dimensions in the thickness direction being particularly exaggerated for the sake of clarity, and moreover the relative thicknesses of the different layers are not drawn to scale.

FIGS. 1 to 16 diagrammatically and in a cross-section taken perpendicularly to the thickness direction show a first example of a device according to the invention in consecutive stages of its manufacture by a method according to the invention.

The starting point is a p-type Si substrate 11 (see FIG. 1). An epitaxial silicon layer may possibly be deposited on the substrate 11, if so desired. Then a mask (not shown), for example of photoresist, is provided, through which a recessed n-type semiconductor region 20 can be formed by means of an n-type ion implantation, such as arsenic ions. After removal of the mask, isolating regions 21 in the form of STI (Shallow Trench Isolation) are formed in a similar manner. A silicon oxide layer is subsequently provided on the—cleaned—surface of the semiconductor body 1 by means of thermal oxidation, for example at 1000° C., which layer is patterned so as to form a gate dielectric region 7. A conductive polycrystalline silicon layer is now deposited with which a gate region 8 is formed. The regions mentioned above form part of a field effect transistor that in its turn is part of the device 10. In this example the field effect transistor is completed for the major part, two such transistors, NMOS in this case, being diagrammatically depicted in the right-hand part of FIG. 1. The source region and the drain region of the left-hand and the right-hand transistor, respectively, and a common source/drain region have not been shown in the drawing. The gate regions 8 are provided with spacers on either side. A covering layer 12 is provided in a pattern over the entire structure. This layer comprises a stack of silicon oxide and silicon nitride layers here which serves not only as a nucleating layer for a subsequent epitaxial step but also as a protective layer for the previously formed MOS transistors. Ideally (as shown) the covering layer 12 extends over the whole of the isolating regions 21, although in practice this is not essential because both the isolating region 21 and the covering layer 12 result in polycrystalline growth when n-type silicon is deposited thereon in a later epitaxial deposition step (see below).

Subsequently (see FIG. 2) a semiconductor layer structure is provided in a single epitaxial process, comprising in the following order: a first n-type silicon layer 22a; a first silicon-germanium-carbon (SiGe:C) layer 33a (in which the carbon is only present at approximately 0.2% hence the layer may alternatively be considered as or referred to as silicon-germanium); a second n-type silicon layer 22b; a p-type silicon-germanium-carbon (SiGe:C) composite layer 33b (in which the carbon is only present at approximately 0.2% hence the layer may alternatively be considered as or referred to as silicon-germanium), and a third n-type silicon layer 22c. In this embodiment, the (SiGe:C) composite layer 33b comprises, in the following order, an undoped Si—Ge:C layer 331, a boron doped Si—Ge:C layer 332, and an undoped Si—Ge:C layer 333. In the above described layers, the conductivity types and compositions are adapted in a simple manner through a change in the composition of the gas conducted through the epitaxy reactor.

Figure 2:
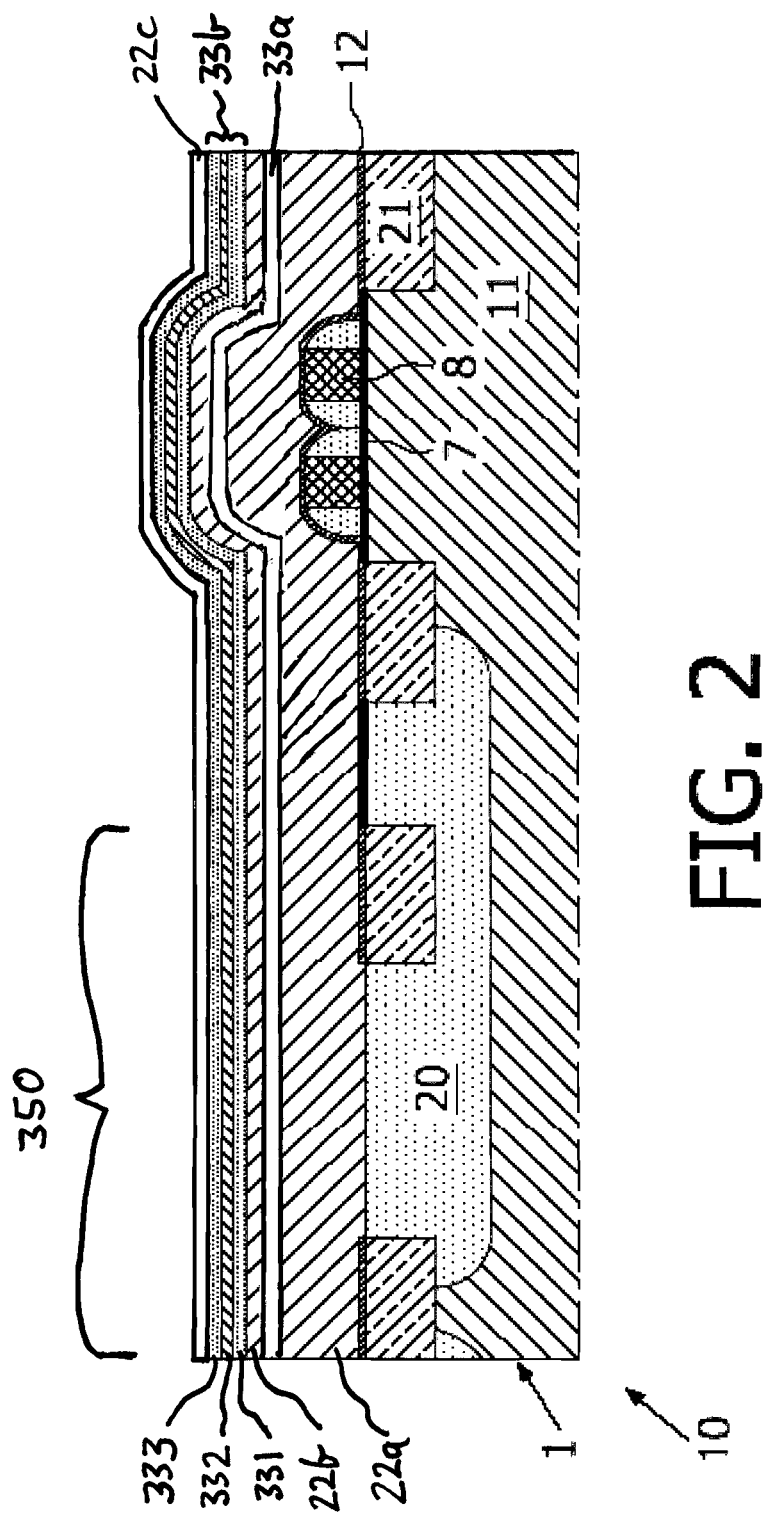
Figure 3:
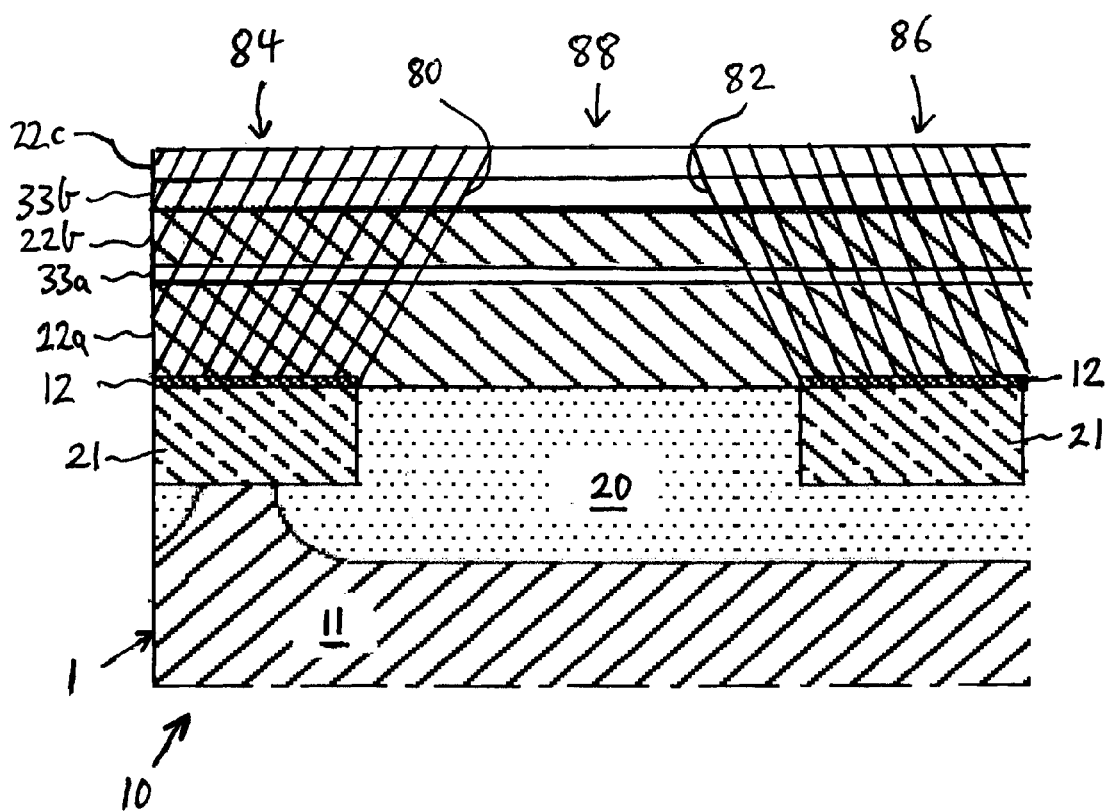
Figure 4:
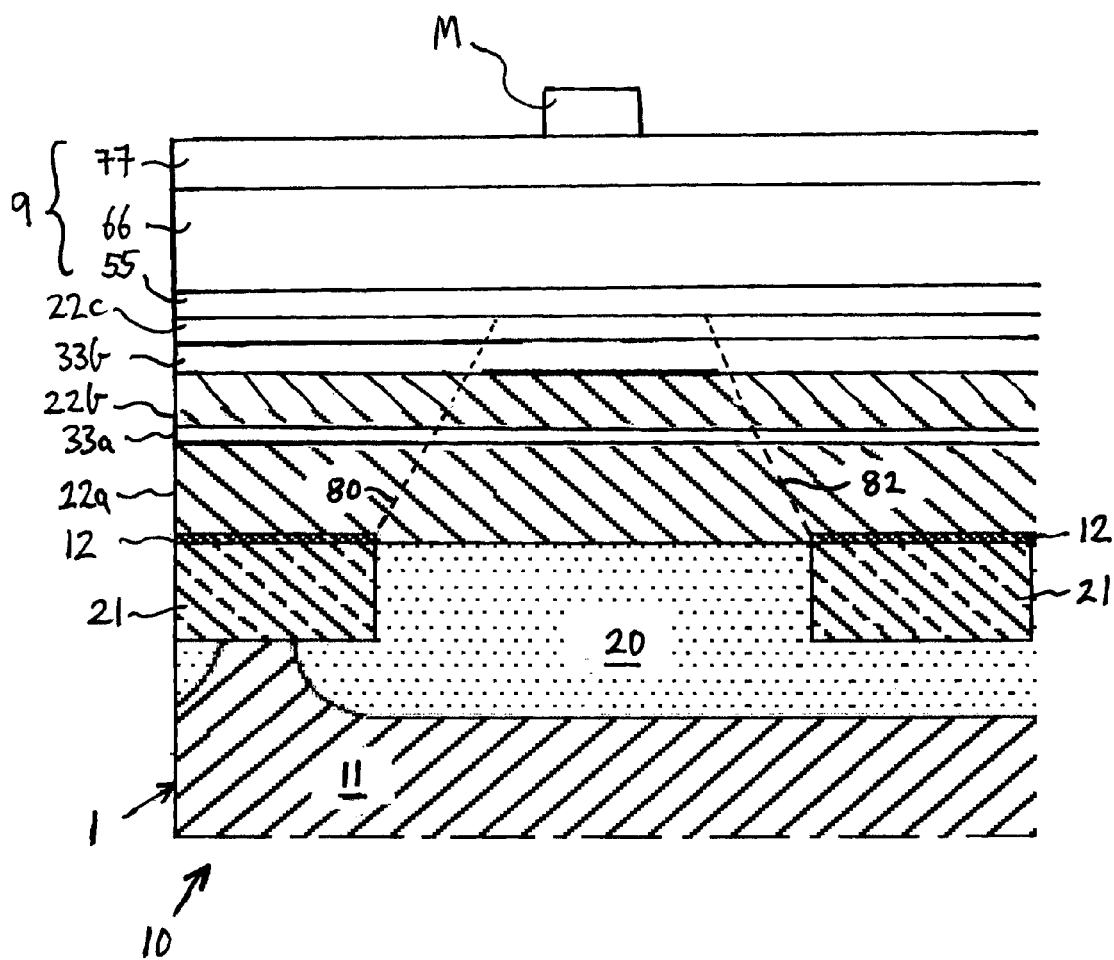

Further details of the n-type silicon layers 22a, 22b and 22c, and the SiGe:C layers 33a and 33b will now be described with reference to FIG. 3, which shows just portion 350 (see FIG. 2) of the structure shown in FIG. 2. For simplicity, in FIG. 3 composite layer 33b is shown as a single layer. It will be appreciated that processes and materials applied in the remainder of the manufacturing process as described below with reference to FIGS. 3-17 are applied to the whole extent of the structure shown in FIG. 2, i.e. to the extent lying outside of portion 350 as well as inside portion 350, in a manner readily understood by the skilled person.

During the above described epitaxial process, the parts of the layers that derive from the interface with the covering layer 12 grow as polycrystalline layers, whereas the parts of the layers that derive from the interface with the uncovered n-type semiconductor region 20 of the silicon substrate grow as monocrystalline layers. The polycrystalline layers will tends to extend in increasing degree into the monocrystalline layers. The resulting structure is shown in FIG. 3. In particular, a first dividing line 80 and a second dividing line 82 are shown for representing dividing lines between a first polycrystalline region 84 and a second polycrystalline region 86, each polycrystalline region indicated by additional shading lines drawn parallel to their respective dividing line 80, 82. A monocrystalline region 88, in the shape of a trapezium as viewed in FIG. 3, is therefore provided and can be seen as that region without the additional shading lines. It will be appreciated that each of the first polycrystalline region 84, the second polycrystalline region 86 and the monocrystalline region 88 extends throughout each of the five layers grown during the epitaxial process, i.e. each of the first n-type silicon layers 22a, the SiGe:C layer 33a, the second n-type silicon layer 22b, the composite SiGe:C layer 33b, and the third n-type silicon layer 22c. This division between polycrystalline and monocrystalline regions will be exploited in subsequent process steps as will be described in detail below. It is noted that when the covering layer 12 does not extend over the whole of the isolating region 21, the division between polycrystalline and monocrystalline regions is not substantially changed because growth on the isolating region 21 is also polycrystalline.

Subsequently (see FIG. 4) a sacrificial layer structure is provided on the semiconductor layer structure by means of CVD. The sacrificial layer structure comprises, in the following order, a silicon dioxide layer 55, a silicon nitride layer 66, and a silicon dioxide layer 77. Then a mask M, of photoresist in this case, is provided in a pattern on top of the sacrificial layer structure aligned over an approximately central part of the monocrystalline region 88.

Figure 5:
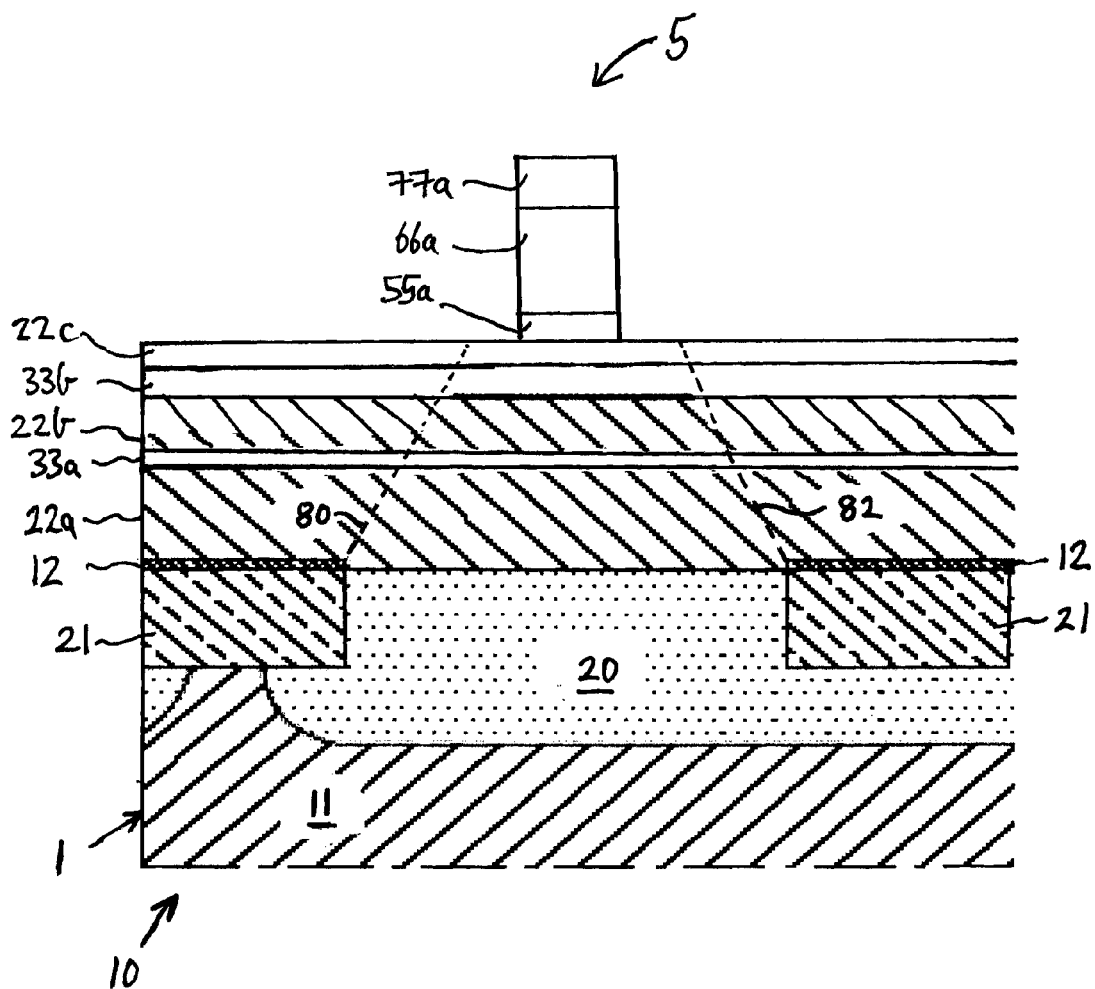
Figure 6:
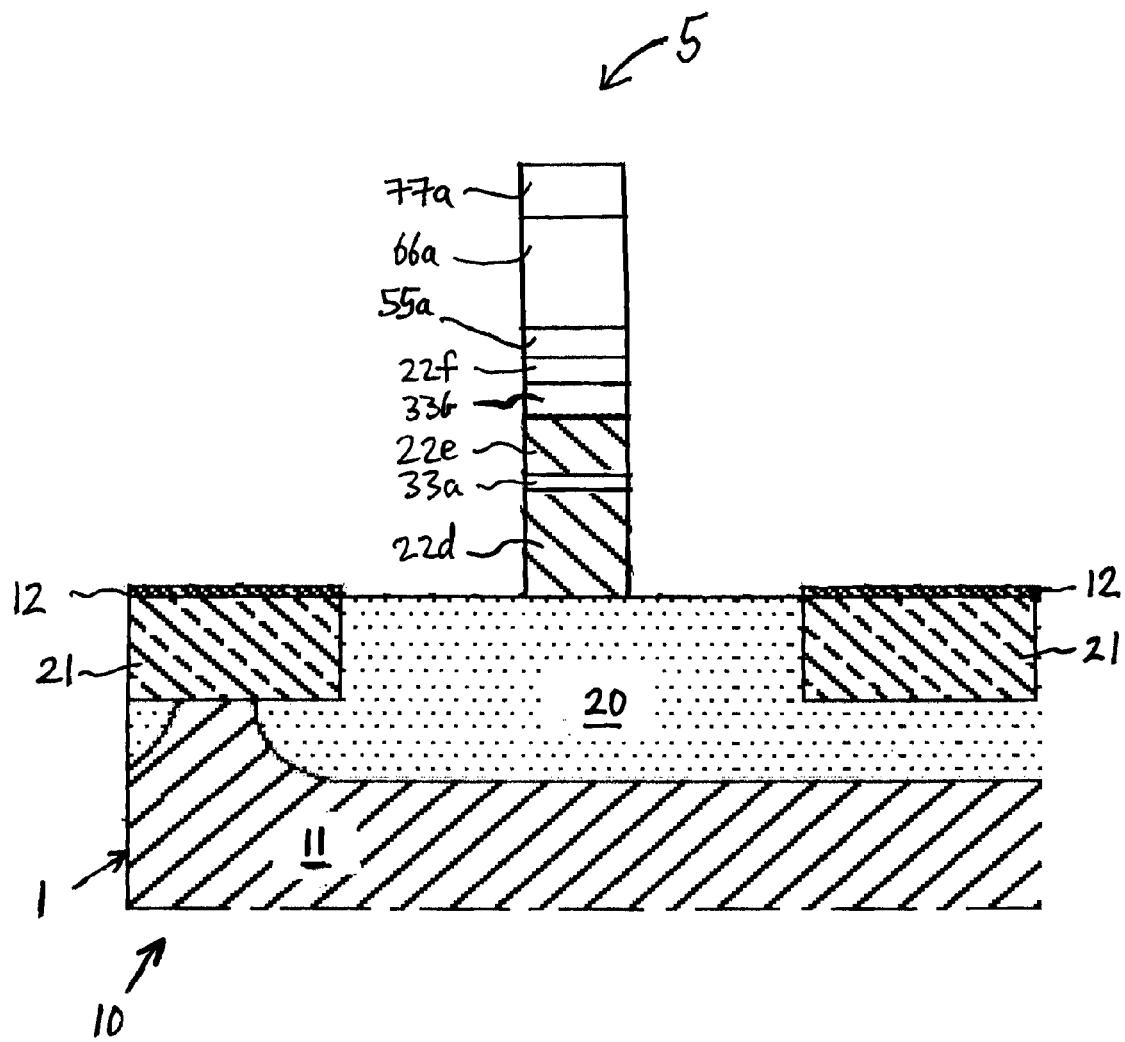

Subsequently (see FIG. 5) a mesa (which may also be referred to as a pedestal) 5 is formed in the (semiconductor) layer structure by means of etching, for example RIE (Reactive Ion Etching) or some other dry etching process, and including respective portions (defined by the mask M) 55a, 66a, 77a of the layers 55, 66, 77. Then the mask M is removed, leaving the structure as shown in FIG. 5.

Subsequently (see FIG. 6) a dry etch is performed, for example by reactive ion etching. The effective mask for the etching is the silicon dioxide portion 77a at the top of the mesa 5. Etching is continued down to the silicon surface of the recessed n-type semiconductor region 20 and down to the covering layer 12. Due to this etching step, the first n-type silicon layer 22a, the SiGe:C layer 33a, the second n-type silicon layer 22b, the composite SiGe:C layer 33b, and the third n-type silicon layer 22c are reduced in width to a width defined by/corresponding to the width of the silicon dioxide portion 77a at the top of the mesa 5. The remaining portion of the first n-type silicon layer 22a with width defined as above provides a first part of the collector region of the bipolar transistor and is indicated by reference numeral 22*d*. The remaining portion of the second n-type silicon layer 22*b* with width defined as above provides a second part of the collector region of the bipolar transistor and is indicated by reference numeral 22*e*. The remaining portion of the third n-type silicon layer 22*c* with width defined as above is indicated by reference numeral 22*f*. The first part 22*d* of the collector region of the bipolar transistor and the second part 22*e* of the collector region of the bipolar transistor together provide the overall collector region of the bipolar transistor.

Subsequently (see FIG. 7) a selective SiGe etch towards silicon is performed (i.e. an etch that selectively removes SiGe:C from the edge-exposed SiGe:C layers 33*a* and 33*c* but not from exposed silicon regions). The etch is time-controlled so that it stops before etching away all the material of the SiGe:C layer 33*a* and the composite SiGe:C layer 33*b*. This leaves (see FIG. 7) the narrower remaining portion of the SiGe:C layer 33*a*, indicated by reference numeral 33*c*, surrounded by a cavity 92, the cavity 92 corresponding to the position of the material of SiGe:C layer 33*a* removed in this selective SiGe etch towards silicon. The collector current flows through this remaining collector window 33*c*. The layer 33*c* acts as a blocking diffusion layer ensuring a sharp doping transition from 22*d* to 22*e*. This also leaves (see FIG. 7) the narrower remaining portion of the composite SiGe:C layer 33*b*, indicated by reference numeral 33*d*, surrounded by a cavity 94, the cavity 94 corresponding to the position of the material of composite SiGe:C layer 33*b* removed in this selective SiGe etch towards silicon. The remaining portion 33*d* of the composite SiGe:C layer with width defined as above and surrounded by cavity 94 provides the base region 33*d* of the bipolar transistor.

Subsequently (see FIG. 8) an electrically insulating layer 16, of high density plasma (HDP) silicon dioxide in this case, is deposited over the structure. The deposition process is determined, adjusted or controlled to provide trapped air (or other gas as required) in the cavities surrounded by silicon dioxide, the trapped air (or other gas) serving as an insulator for the cavities 92 and 94. In other embodiments, the cavities 92 and 94 are filled with the insulating silicon dioxide. (As an aside, it is also noted that by virtue of this silicon dioxide deposition step, the silicon dioxide portion 77*a* at the top of the mesa 5 is effectively incorporated, at least in a functional sense, into the newly deposited silicon dioxide insulating layer 16.)

Subsequently (see FIG. 9) the resulting structure is planarized by chemical mechanical planarization (CMP).

Subsequently (see FIG. 10) the insulating layer 16 is etched back on either side of the mesa 5 and stopped in the first part 22*d* of the collector region.

Figure 11:
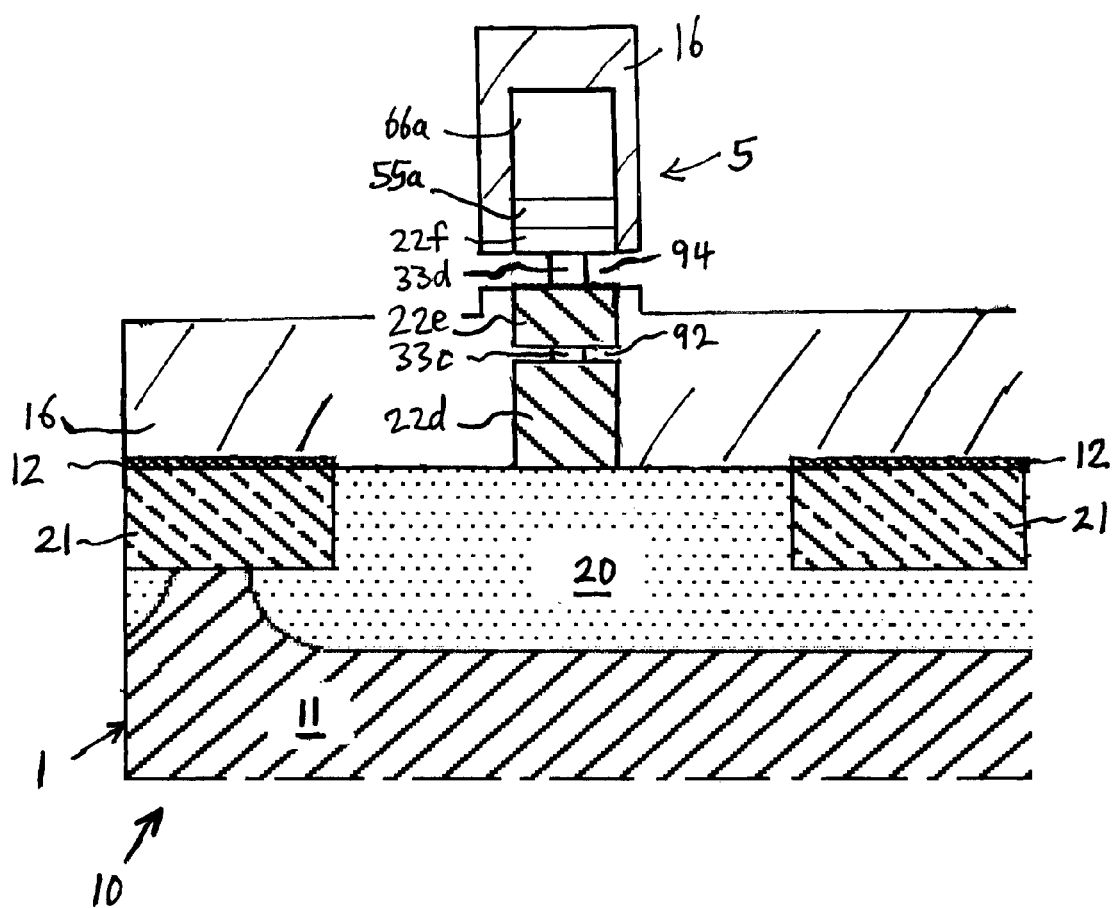

Subsequently (see FIG. 11) further silicon dioxide is deposited by plasma oxide deposition, to provide in effect a further part of the insulating layer 16 up to a height in the second part 22*e* of the collector region and further around the remainder of the mesa 5, as shown in FIG. 11. This oxide deposition is non-conformal and creates a void at the outer rim of the cavity 94 hence widening the cavity 94 as shown in FIG. 11. In this embodiment the cavity 92 remains gas filled. However, in other embodiments the cavity 92 or both the cavities 92 and 94 may be filled by the silicon dioxide.

Subsequently a conductive polycrystalline silicon layer 13, in this case boron-doped (i.e. p-doped), is deposited. In this embodiment the cavity 94 is also filled with polycrystalline silicon.

During the thermal anneal process that is used to activate the dopants in both the bipolar and the MOS transistors, the second part of the collector region 22*e* will be p-type doped from the conductive polycrystalline silicon layer 13. The diffusion of this p-type dopant is effectively blocked at the cavity 92, thus preventing it from further moving into the first part of the collector region 22*d* which is n-type doped. This effectively limits the area over which the p-type base dopant and the n-type collector dopant meet. This strongly decreases the parasitic base-collector capacitance.

Figure 12:
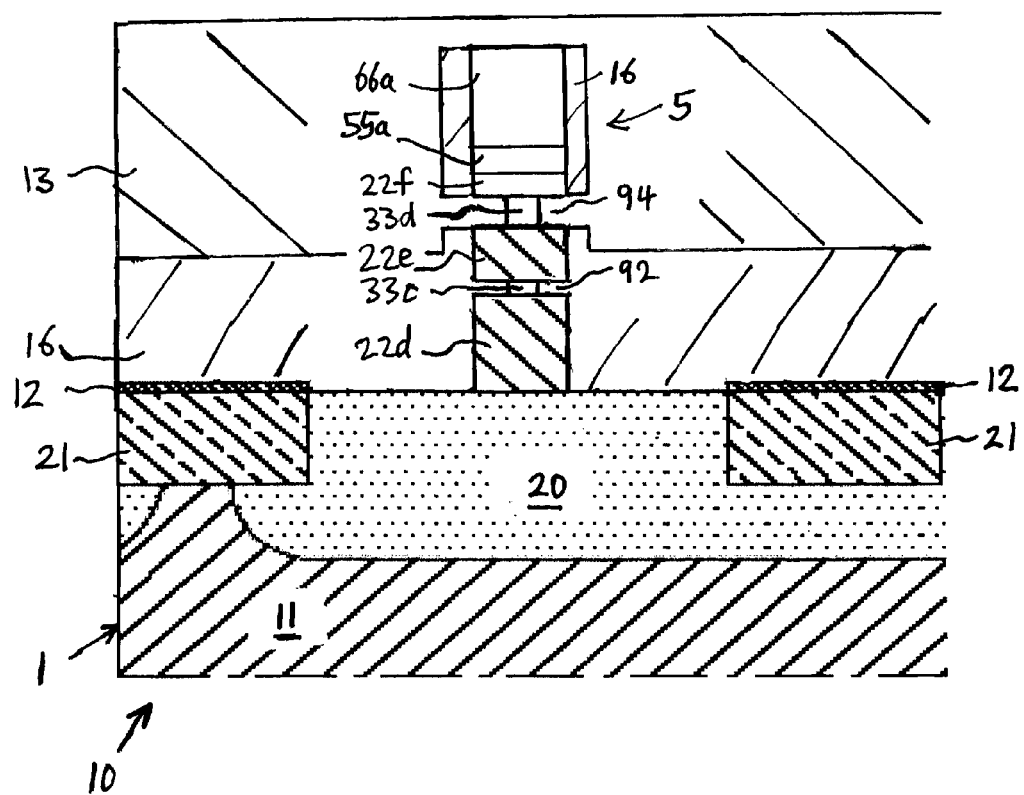
Figure 13:
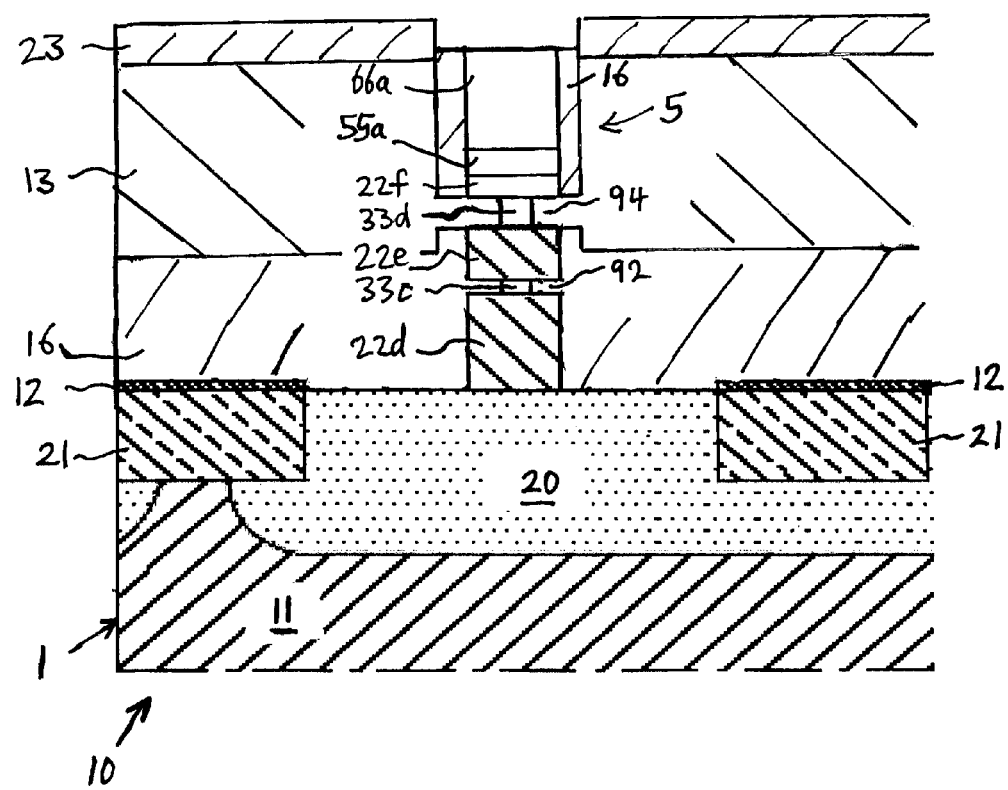
Figure 14:
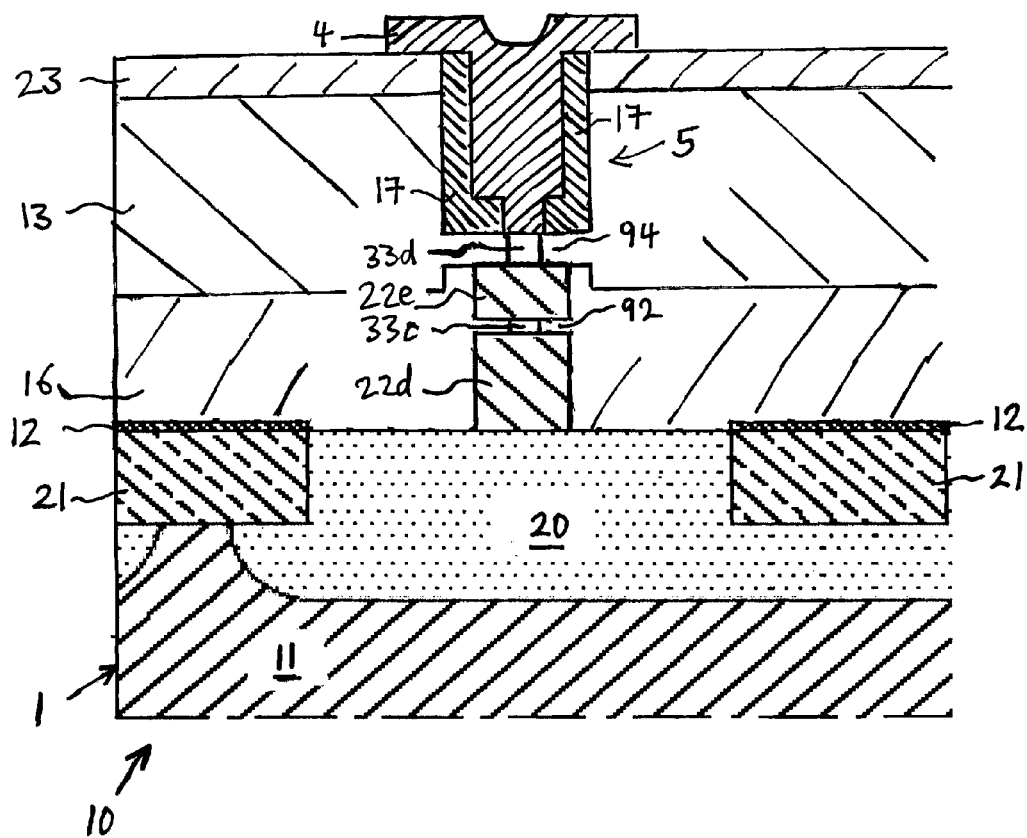
Figure 15:
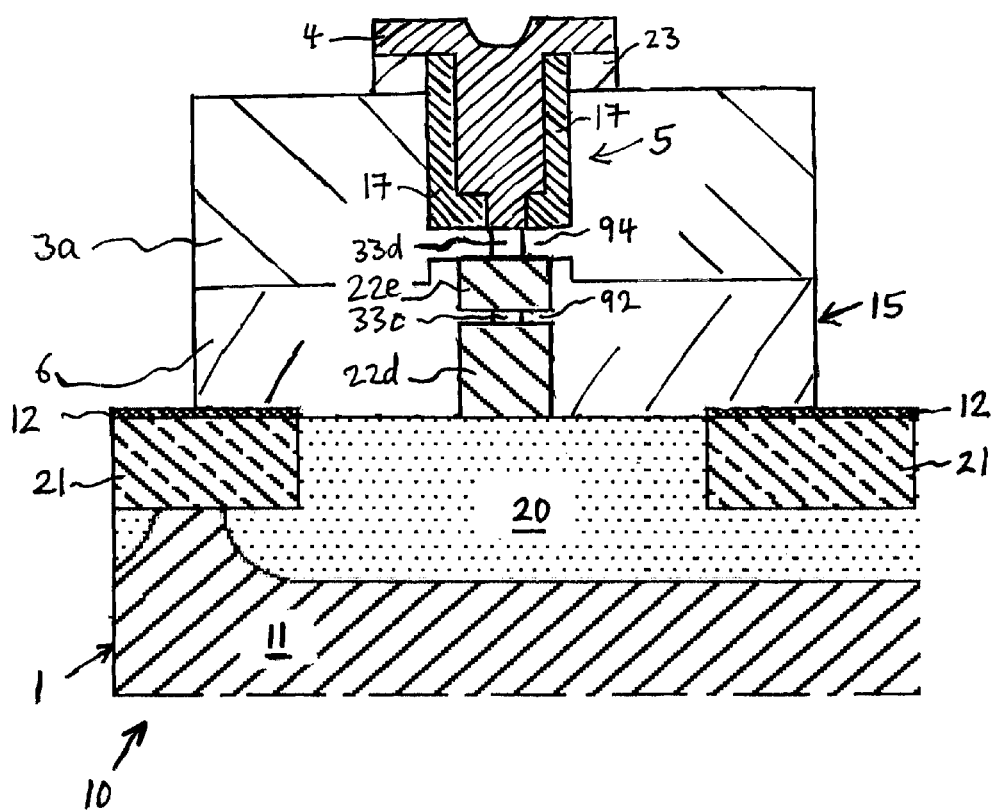
Figure 16:
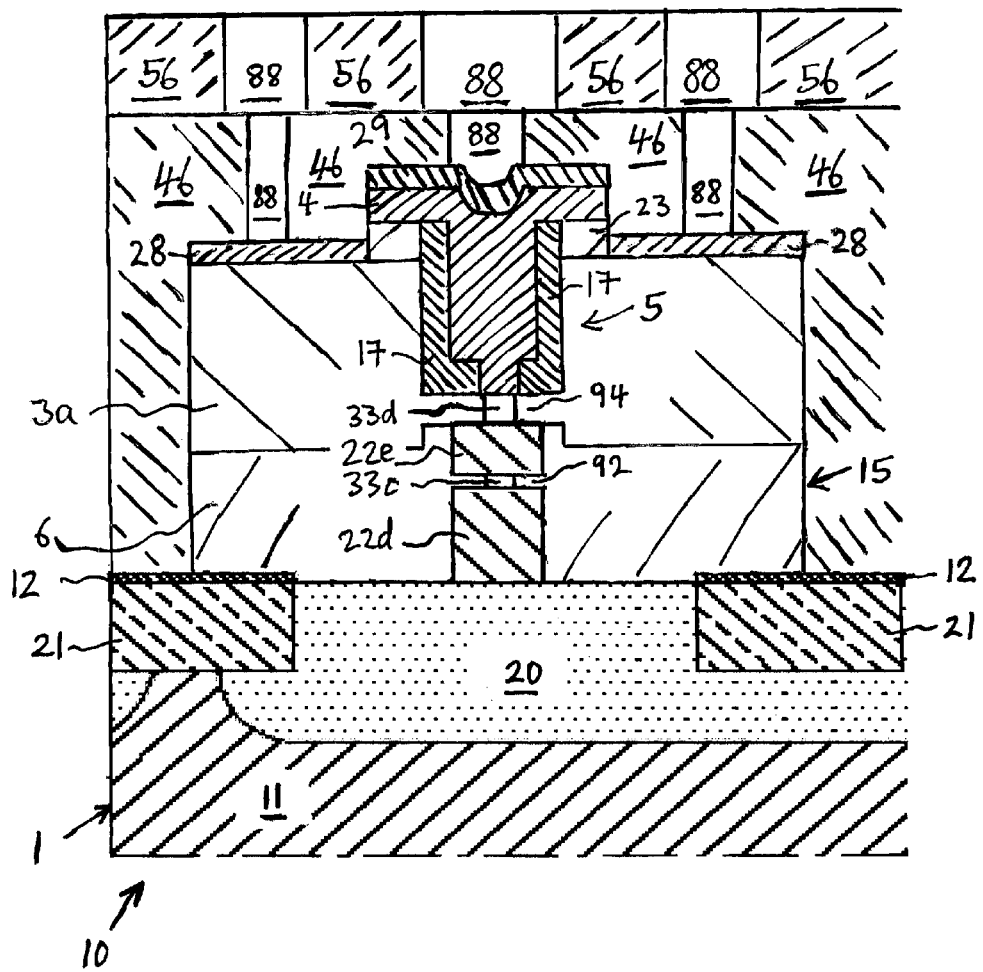

The resulting structure is then planarized leaving the conductive polycrystalline silicon layer 13 planarized above the silicon nitride portion 66*a* as shown in FIG. 12.

Subsequently (see FIG. 13) the upper side of the conductive polycrystalline silicon layer 13 is then converted into an isolating region 23 of silicon dioxide by means of wet thermal oxidation.

Subsequently (see FIG. 14) the silicon nitride portion 66*a*, the silicon dioxide portion 55*a*, the remaining portion of the third n-type silicon layer 22*f*, and the portion of the insulating layer 16 around the mesa 5 are removed in a few (selective) etching steps. This provides the structure with a cavity, in which spacers 17 are formed, of silicon nitride in this case, through deposition of a uniform layer followed by the removal of the horizontal portions thereof through anisotropic etching. A polycrystalline silicon layer 4 is then deposited and patterned, said layer forming an epitaxial/monocrystalline emitter region 4 of the bipolar transistor in the cavity between the spacers 17.

Subsequently (see FIG. 15), with the emitter region 4 serving as a mask, the isolating region 23 is removed outside the emitter region 4 by means of etching, whereby a base connection region 3*a* is exposed i.e. formed from the conductive polycrystalline silicon layer 13. A further mesa 15 is then formed around the mesa 5 by means of etching with a mask (not shown), for example made of photoresist, thus forming from the isolating layer 16 an isolation region 6 which surrounds the bipolar transistor.

Subsequently (see FIG. 16) the portions of the covering layer 12 exposed during the formation of the further mesa 15 is removed by etching, whereupon both the emitter region 4 and the base connection region 3*a* are provided with respective silicide regions 28, 29, such as of nickel or cobalt silicide. The source and drain regions and the gate region of the field effect transistor(s) may be provided with metal silicide regions at the same time. After further isolating layers 46, 56 have been provided and have been given suitable openings by means of photolithography, electrical connections 88 are provided therein with which both the bipolar transistor and the field effect transistor can be electrically connected.

In the above described embodiment, the insulating cavities 92 and 94 are formed by the end of the processes described with reference to FIG. 7. Thereafter, a process of manufacturing one example of a possible overall structure has been described with reference to FIGS. 8-16. It will however be appreciated that any suitable overall structure may be provided to the embodiment of the invention represented by the structure shown in FIG. 7. For example, other field effect transistors may be provided instead of the one described above.

It will furthermore be appreciated that in other embodiments, other materials or layer configurations other than those described above may be employed. For example, one or more of the SiGe:C layers 33*a* and 33*b* may be replaced by other material. Also for example, alternative materials and/or processes may be used for the dummy emitter and the spacers.

Thus a semiconductor device comprising a bipolar transistor and a field effect transistor device, and manufacturing method therefor, are provided in which a first self-aligned insulating cavity, for example an oxide cavity or gas (e.g. air)

cavity, is provided for blocking diffusion from the base region of the bipolar transistor. As such, the first insulating cavity can be described as defining the base contact. The first insulating cavity provides a reduction in the base collector capacitance.

A second self-aligned cavity is provided for blocking diffusion from the collector. As such, the second insulating cavity can be described as the defining the collector region and provides a reduction in the base collector capacitance. The composition of the two layers (i.e. the respective layers from which the two cavities are formed) may be different in order to create different cavity depth and/or control the collector diffusion.

A further embodiment will now be described with reference to FIGS. 17-22. The further embodiment is the same as that described above, except in relation to the inclusion of a spacer or spacers next to the intrinsic part of the heterojunction bipolar transistor, as will be explained in more detail below. As such, it will be appreciated that any build details, options or other details described above for the preceding embodiments also apply to the following embodiment, except where stated otherwise.

In this embodiment, the spacers reduce the extrinsic base-collector capacitance, provide the possibility for a thick extrinsic base layer, which reduces the extrinsic base resistance, and make the external base connection less or non-critical. The implementation of the spacers enables further improvement of the RF performance, and the maximum oscillation frequency or unity power gain cut-off frequency ($f_{max}$) in particular.

The inclusion of spacers next to the intrinsic part of the heterojunction bipolar transistor tends to enable the following opportunities:
 reduction of the extrinsic base-collector capacitance;
 use of a thick poly-Si or poly-SiGe layer to form a low resistance extrinsic base layer; and
 making the external base connection less or non-critical.

The making the external base connection less or non-critical is achieved because it is no longer require to control as precisely the level to which the HDP oxide surrounding the intrinsic device is etched back after a very critical CMP process as sis the case in the earlier described embodiments. If the HDP oxide is etched back considerably lower than the level of the intrinsic SiGe:C base layer, the spacers of this embodiment will prevent the collector-base capacitance from increasing. This non-critical base connection alleviates the range control that is required for the oxide CMP process as a too long range across the wafer may cause serious problems during the oxide etch back. The use of the spacers tends to further improve the RF performance, and $f_{max}$ in particular.

In overview, the following are processed after dummy emitter creation and etching of parasitics:
 deposition of pacer stack;
 spacer formation by dry etching;
 same processing thereafter as for the earlier described embodiments.

The spacer structures are implemented next to the pedestal, which forms the intrinsic device, as follows.

In this embodiment, the device is initially manufactured in the same manner as is described for the earlier described embodiments with reference to FIGS. 1 to 7, and the same reference numerals will be used for the same elements in the following description and FIGS. 17 to 22.

FIGS. 17 to 22 diagrammatically and in a cross-section taken perpendicularly to the thickness direction show the device of this embodiment in consecutive stages of its manufacture that are implemented after carrying out the manufacturing stages described above with reference to FIGS. 1 to 7.

Figure 7:
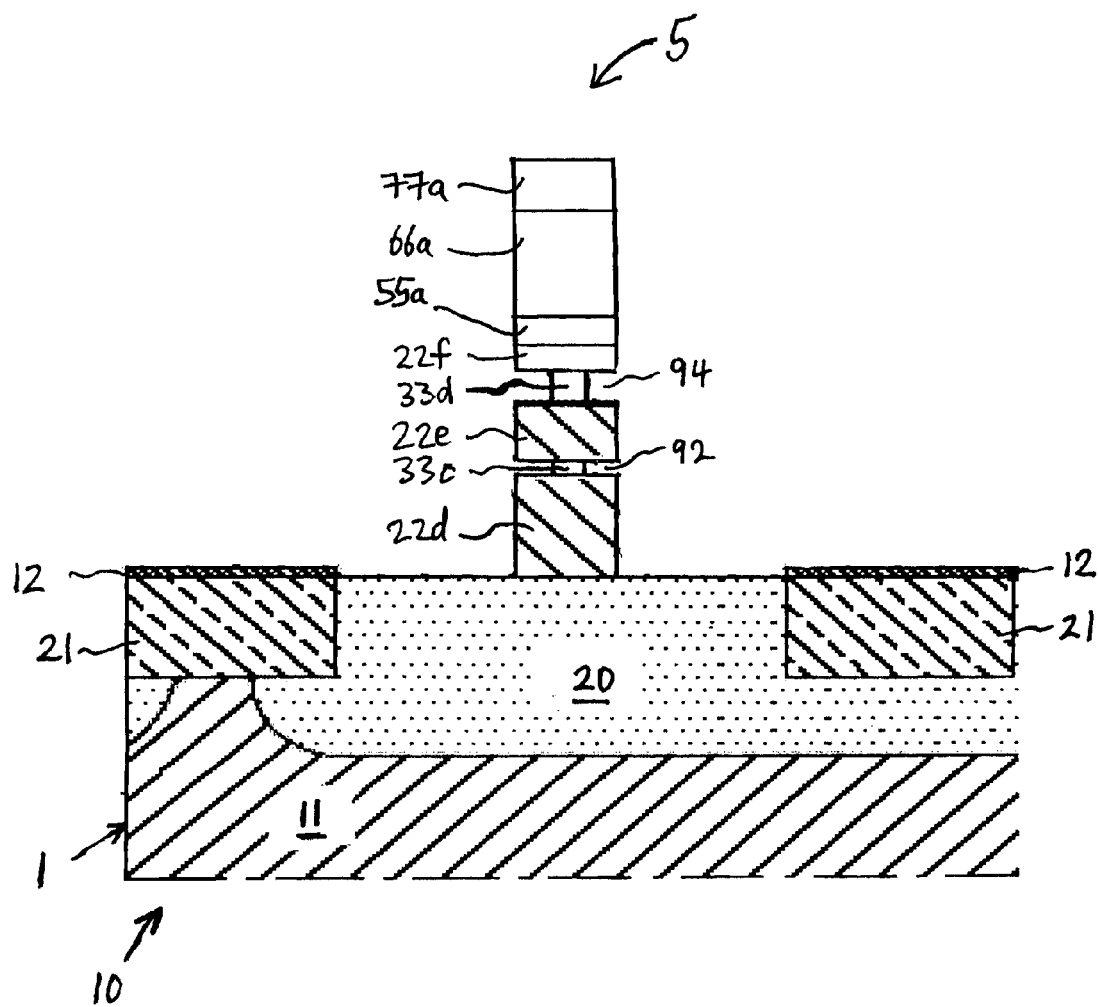
Figure 8:
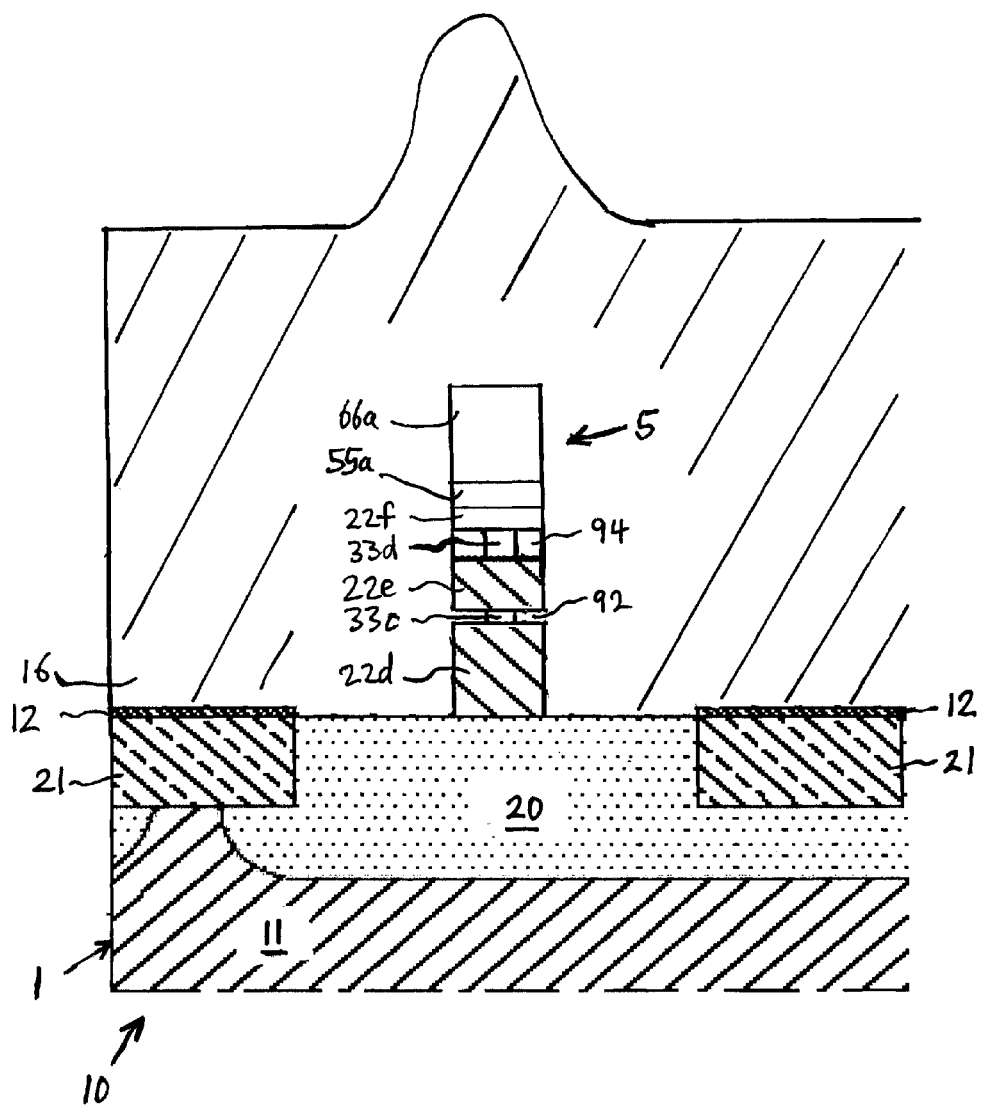
Figure 9:
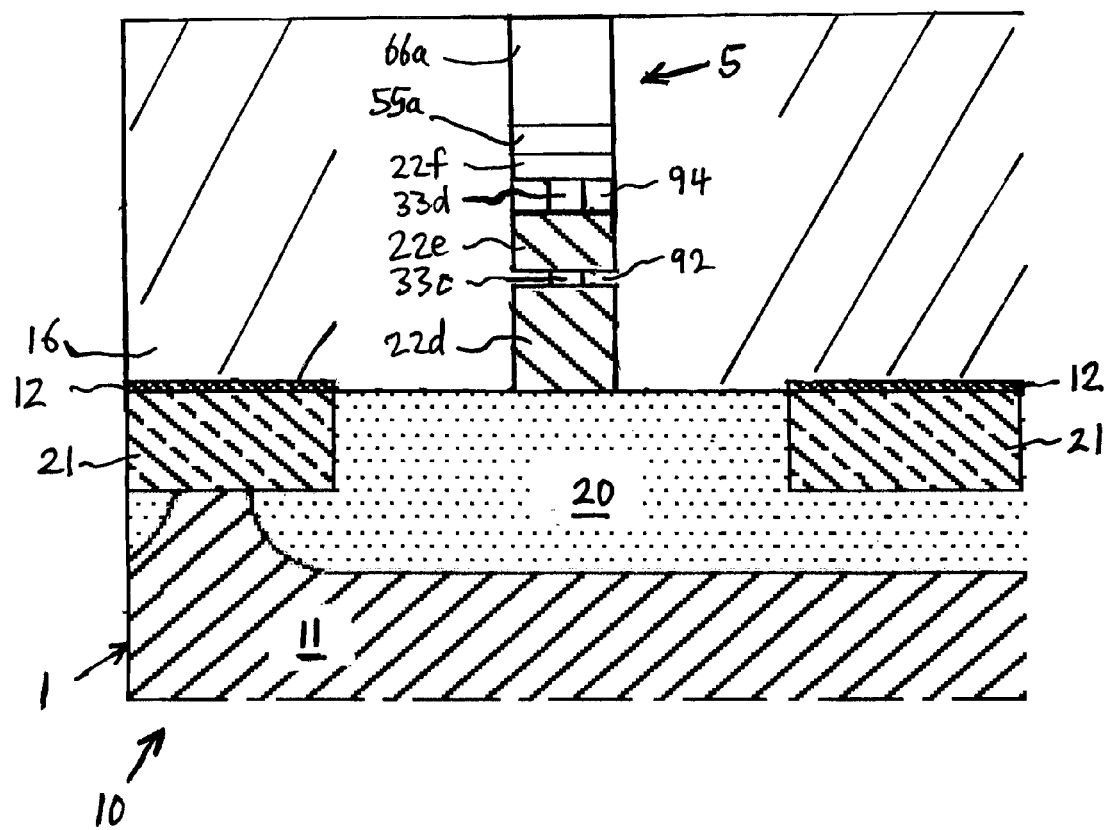
Figure 10:
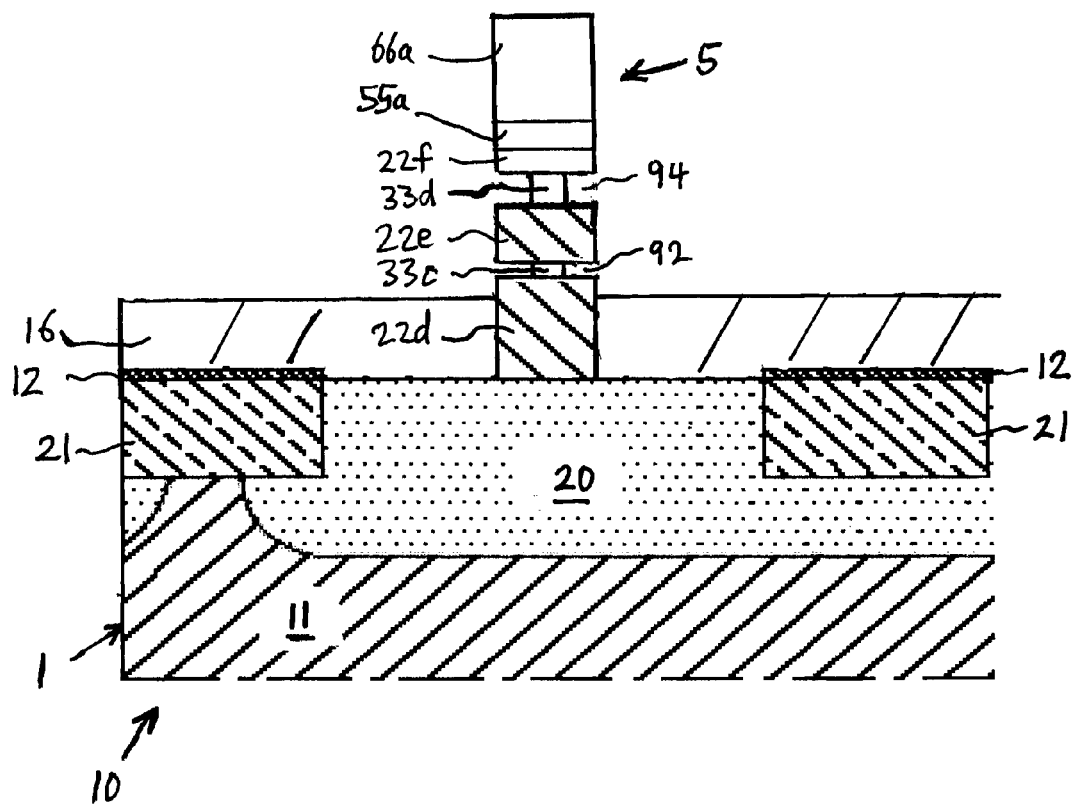
Figure 17:
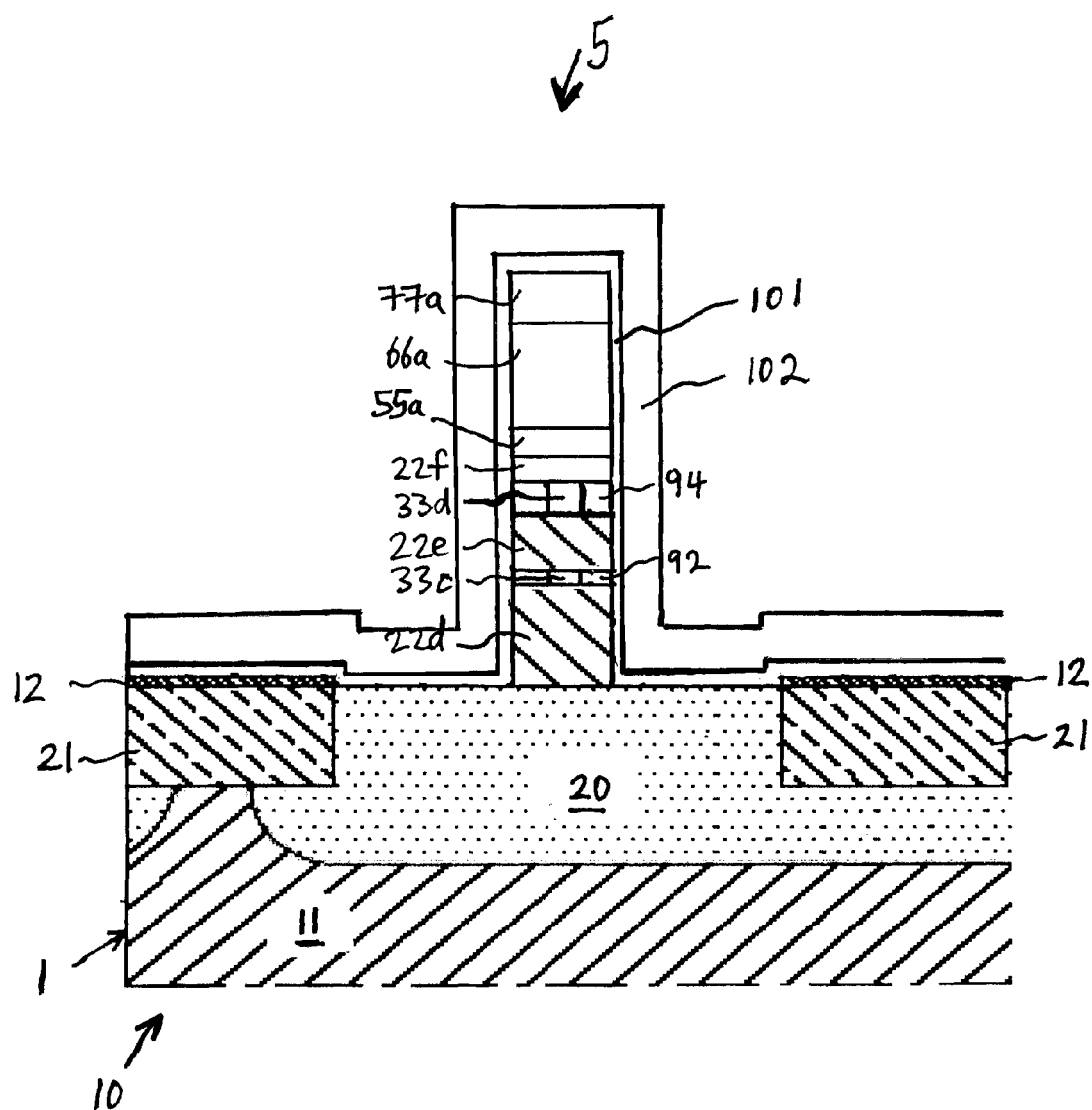

Referring to FIG. 17, after the lateral Si—Ge:C dry etching of FIG. 7, the implementation of the spacers next to the pedestal begins with the deposition of a spacer stack material comprising a layer of $SiO_2$, indicated by reference numeral 101, and a layer of $Si_3N_4$, indicated by reference numeral 102.

Figure 18:
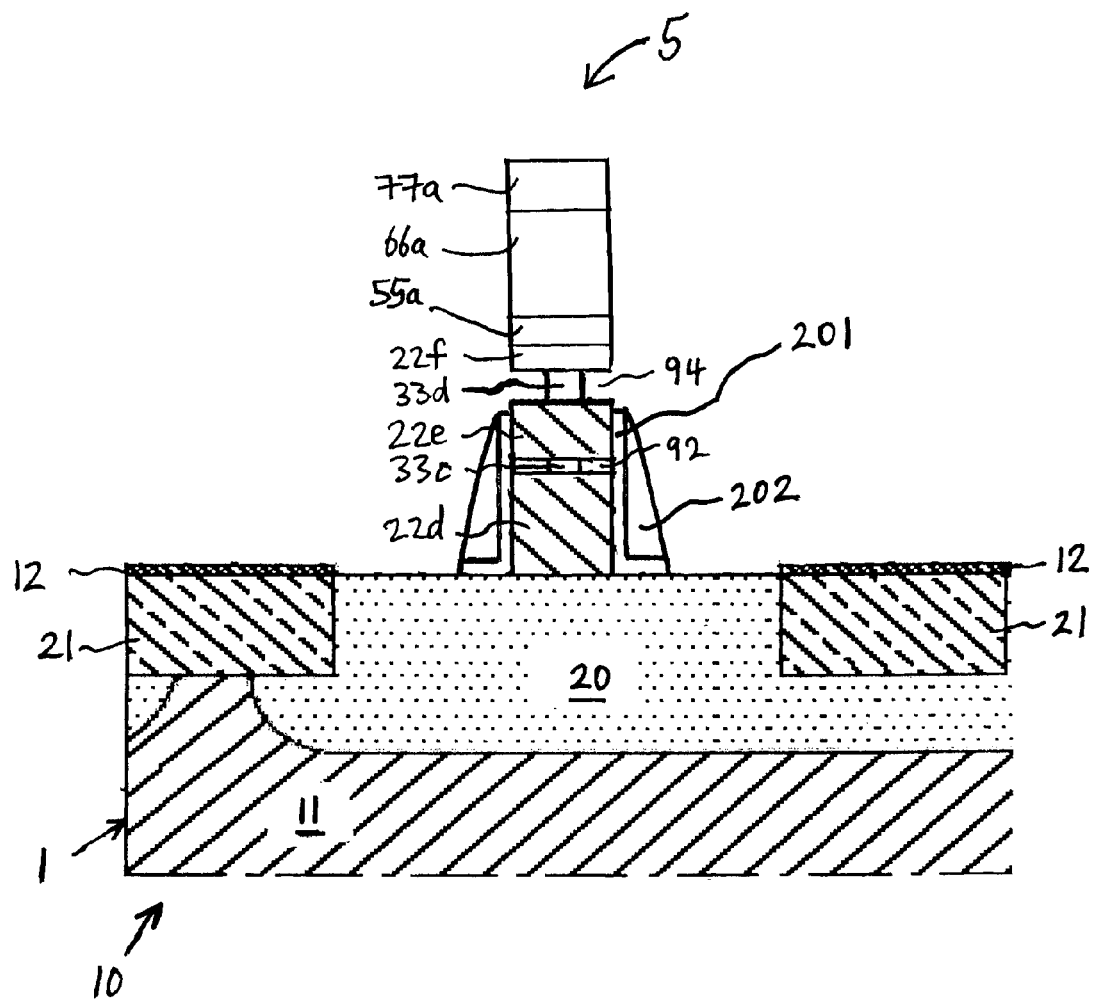

The spacers are then formed by dry etching. Note that the cavities in the SiGe:C diffusion-stop layer will remain sealed by the spacers and hence these cavities (e.g. air cavities) will contribute to the reduction of the intrinsic base-collector capacitance as described for the earlier embodiment above. FIG. 18 shows the spacers formed next to the pedestal after the dry etching, where a $SiO_2$ spacer is indicated by reference numeral 201 and a $Si_3N_4$ spacer is indicated by reference numeral 202.

Next, the process is continued along the lines described earlier above with reference to FIG. 8 onwards, including deposition of a liner oxide and HDP oxide followed by a CMP process. Some of these steps are depicted in FIGS. 19 to 22.

Figure 19:
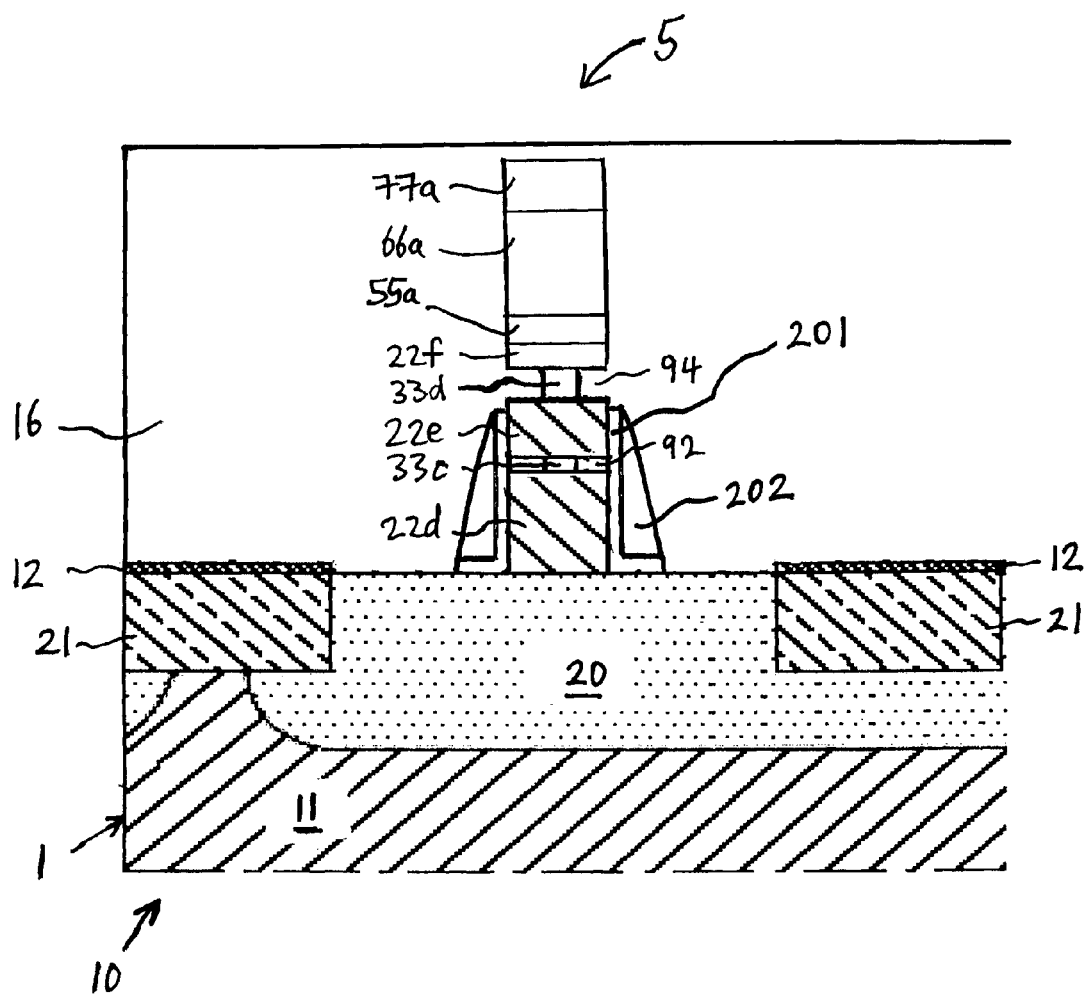
Figure 20:
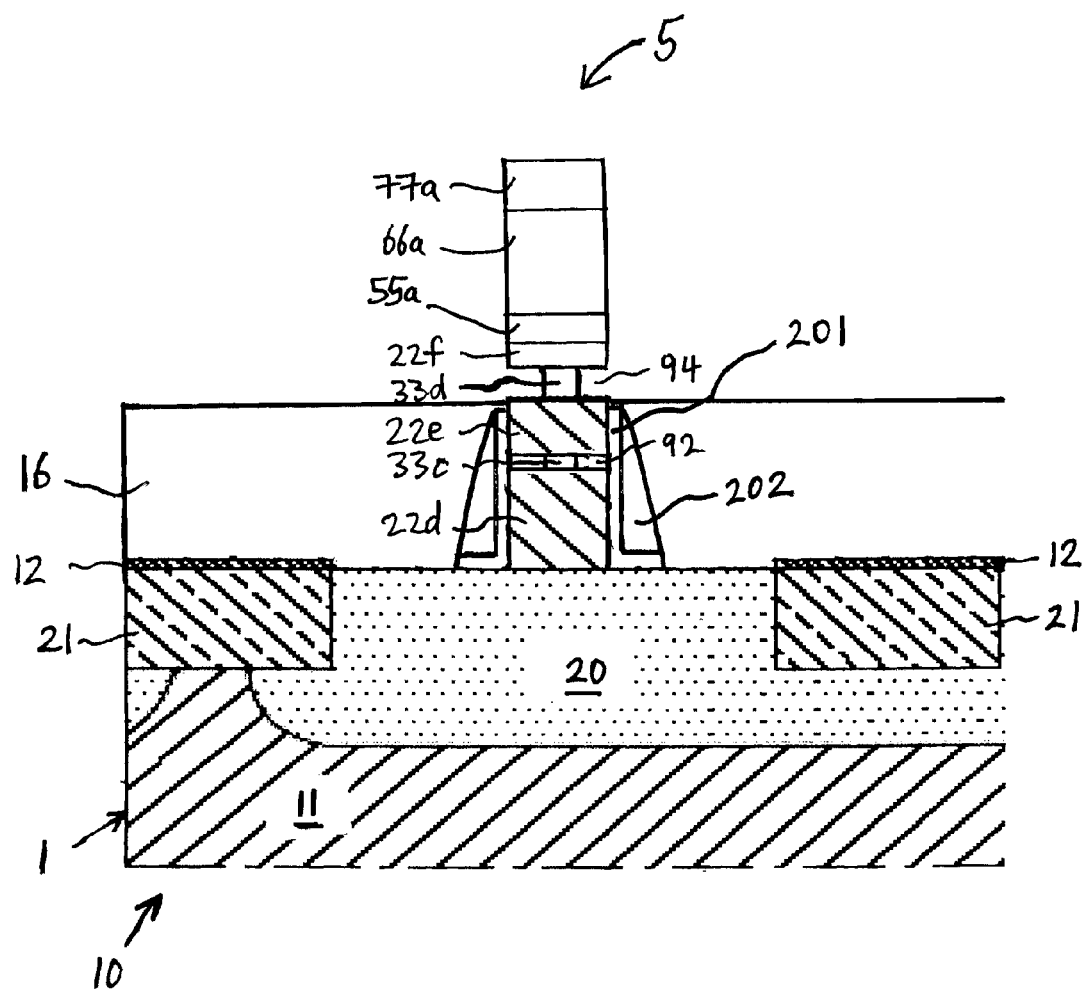

FIG. 19 shows liner and HDP oxide deposition followed by an oxide CMP process stopping just above or on the nitride dummy emitter.

After the oxide CMP process, the HDP oxide is recessed using a wet or dry etch to make the SiGe:C intrinsic base layer accessible for connection with the extrinsic poly-Si or poly-SiGe base layer. Without the spacers next to the pedestal, the oxide etch back level has to be controlled very precisely in order to keep the extrinsic collector-base capacitance as small as possible. this means that the HDP oxide should be etched back to a level just below the intrinsic SiGe:C base layer i.e. as shown by way of comparison in FIG. 20 (i.e. FIG. 20, despite having the spacers shown, nevertheless for the sake of explanation shows where the etch level would be if the spacers were not included).

Figure 21:
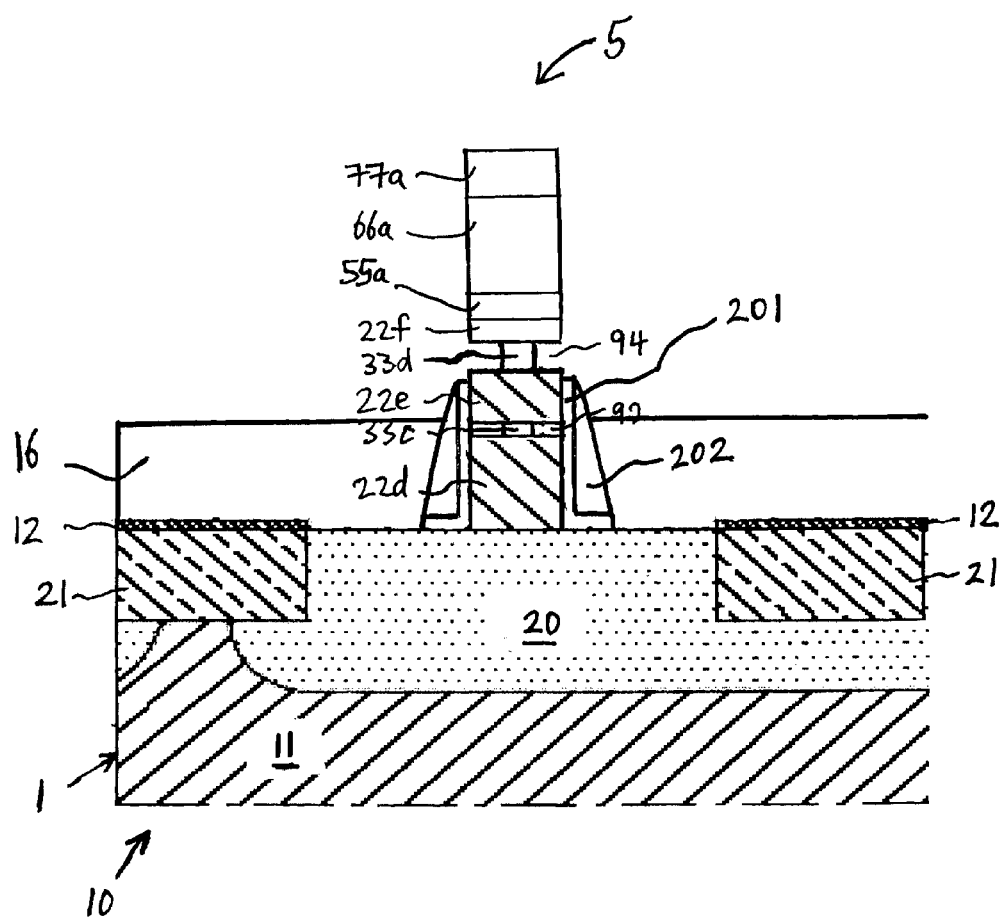

FIG. 21 however, shows where the etch level instead is advantageously positioned in this embodiment as is possible due to the presence of the spacers. In more detail, one of the advantages of the spacers next to the pedestal is that the very precise control of the HDP oxide etch back level is no longer required. If the HDP oxide is etched back considerably lower than the level of the intrinsic SiGe:C base layers, the spacers will prevent the collector-base capacitance from increasing. This non-critical base connection alleviates the range control that is required for the oxide CMP process as a too long range across the wafer tends to cause possible problems during the oxide etch back. For example, a range, i.e. the difference between the thinnest and thickest oxide thicknesses across the wafer, of 30 nm translates to an etch time difference of approximately two minutes if etching in an HF2% solution. These non-uniformities in the oxide CMP process and HDP etch back level can make the base connection tedious and critical. Implementing the spacers next to the pedestal tends to make the base connection non-critical. This is shown in FIG. 21.

The possibility to etch back the HDP oxide to a lower level without compromising on the collector-base capacitance also provides an opportunity to form a thick low resistance extrinsic base layer. These improvements in both collector-base capacitance and extrinsic base resistance tend to further improve the RF performance of the HBT.

Figure 22:
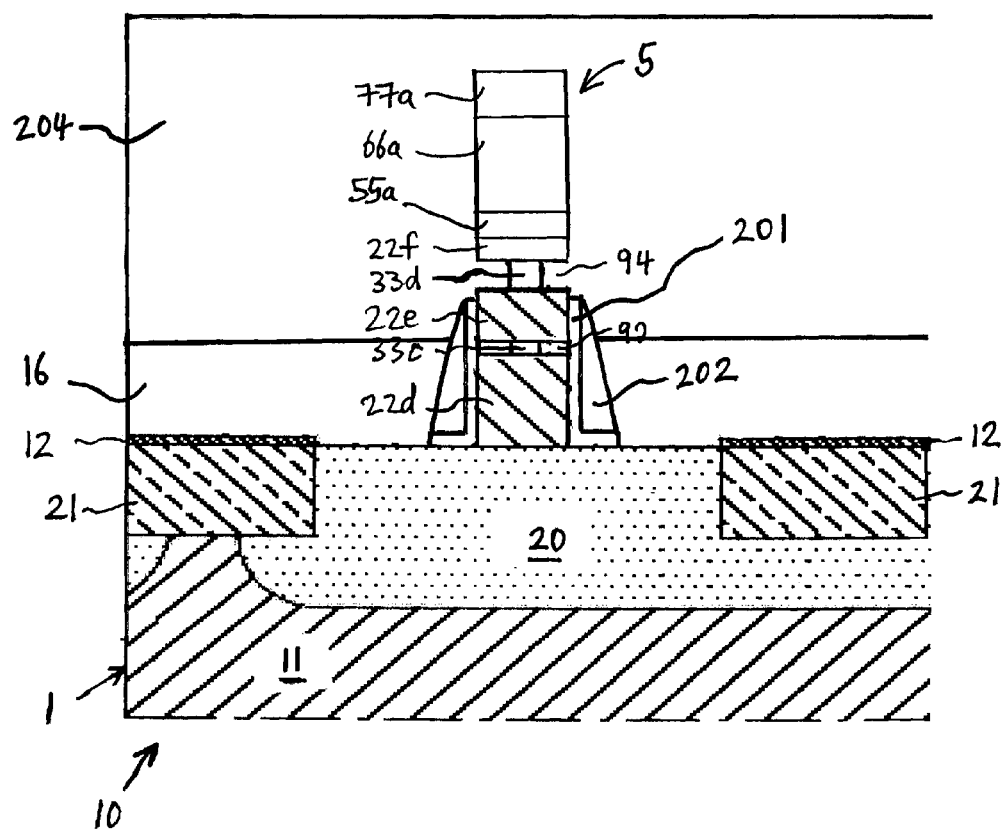

After the HDP oxide etch back a heavily p-type extrinsic poly-Si or poly-SiGe base layer is deposited, for example either using an oven process or epitaxial growth, followed by a CMP process that stops just above or on the nitride dummy emitter. FIG. 22 shows the situation after poly CMP for the case where the HDP oxide has been etched back considerably below the level of the intrinsic SiGe:C base. In FIG. 22 the heavily p-type extrinsic poly-Si or poly-SiGe base layer is indicated by reference numeral 204.

The remaining procedures are carried out along the lines of those described earlier above with respect to FIGS. 8 to 16.

In this embodiment two adjacent spacers are provided, namely the $SiO_2$ spacer 201 and the $Si_3N_4$ spacer 202. However, in other embodiments, other materials may be used for the spacers, and/or the number of adjacent spacers may be other than two, being for example just one spacer. Also, the two adjacent spacers of this embodiment may instead be considered as one spacer made of two layers. In other embodiments, such a spacer may have other numbers of layers, which may be of other materials.

The invention claimed is:

1. A semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region; characterised in that:
    the semiconductor device further comprises a field effect transistor;
    the bipolar transistor is provided with a first insulating cavity provided in the collector region; and
    the base region is narrower in the plane of the substrate than the collector region due to a second insulating cavity provided around the base region and between the collector region and the emitter region.

2. A semiconductor device according to claim 1, comprising a remaining portion of a layer defining the first insulating cavity in the collector region, wherein the remaining portion of said layer is surrounded by the first insulating cavity blocks diffusion from the collector region.

3. A semiconductor device according to claim 2, wherein the remaining portion of the layer defining the first insulating cavity and surrounded by the first insulating cavity is SiGe:C.

4. A semiconductor device according to claim 1, further comprising a dummy emitter.

5. A semiconductor device according to claim 1, wherein the first insulating cavity is filled with a gas.

6. A semiconductor device according to claim 5 wherein the gas is air.

7. A semiconductor device according to claim 1, wherein the first insulating cavity is filled with silicon dioxide.

8. A method of manufacturing a semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region; characterised by:
    further providing the semiconductor device with a field effect transistor;
    providing the bipolar transistor with a first insulating cavity in the collector region; and
    providing the bipolar transistor with a second insulating cavity, the second insulating cavity being provided around the base region and between the collector region and the emitter region such that the base region is narrower in the plane of the substrate than the collector region.

9. A method according to claim 8, comprising providing a remaining portion of a layer defining the first insulating cavity in the collector region, wherein the remaining portion of said layer is surrounded by the first insulating cavity, for blocking diffusion from the collector region.

10. A method according to claim 9, wherein the remaining portion of the layer defining the first insulating cavity and surrounded by the first insulating cavity is SiGe:C.

11. A method according to claim 8, wherein a dummy emitter is provided.

12. A method according to claim 8, wherein the first insulating cavity is filled with a gas.

13. A method according to claim 12 wherein the gas is air.

14. A method according to claim 8, wherein the first insulating cavity is filled with silicon dioxide.

15. A semiconductor device according to claim 1, further comprising at least one spacer provided adjacent to a portion of the projecting mesa so as to reduce base-collector capacitance.

16. A semiconductor device according to claim 15, wherein the isolating region is lower than the base region.

17. A method according to claim 8, further comprising providing at least one spacer adjacent to a portion of the projecting mesa for reducing base-collector capacitance.

18. A method according to claim 17, wherein the isolating region is etched back lower than the base region.

\* \* \* \* \*